United States Patent [19]

Guicheteau

[11] 4,013,899
[45] Mar. 22, 1977

[54] APPARATUS FOR CONVERTING A POTENTIAL SIGNAL DEVELOPED BETWEEN TWO HIGH IMPEDANCE ELECTRODES TO A CURRENT SIGNAL AND FOR TRANSMITTING THIS CURRENT SIGNAL TO A REMOTE LOCATION OVER A TWO WIRE TRANSMISSION

[75] Inventor: Eugene H. Guicheteau, Audubon, Pa.

[73] Assignee: Honeywell Inc., Minneapolis, Minn.

[22] Filed: Mar. 26, 1976

[21] Appl. No.: 671,000

[52] U.S. Cl. .......................... 307/235 F; 307/308; 307/296 R; 330/30 D; 324/30 R
[51] Int. Cl.² ...................................... H03K 17/00
[58] Field of Search .......... 307/308, 229, 230, 235, 307/296; 330/30 D; 324/30 R

[56] References Cited

UNITED STATES PATENTS

| 27,668 | 6/1973 | Slotz et al. ....................... 330/30 D |
| 3,786,345 | 1/1974 | Mikkelsen ....................... 324/30 R |

Primary Examiner—Stanley D. Miller, Jr.
Assistant Examiner—B. P. Davis
Attorney, Agent, or Firm—Laurence J. Marhoefer; Lockwood D. Burton

[57] ABSTRACT

A two-wire voltage to current converter and transmitter for extremely high output impedance transducers has an input which floats with respect to the power supply ground potential and is referenced to the power supply ground potential by means of a level shifting comparator.

4 Claims, 2 Drawing Figures

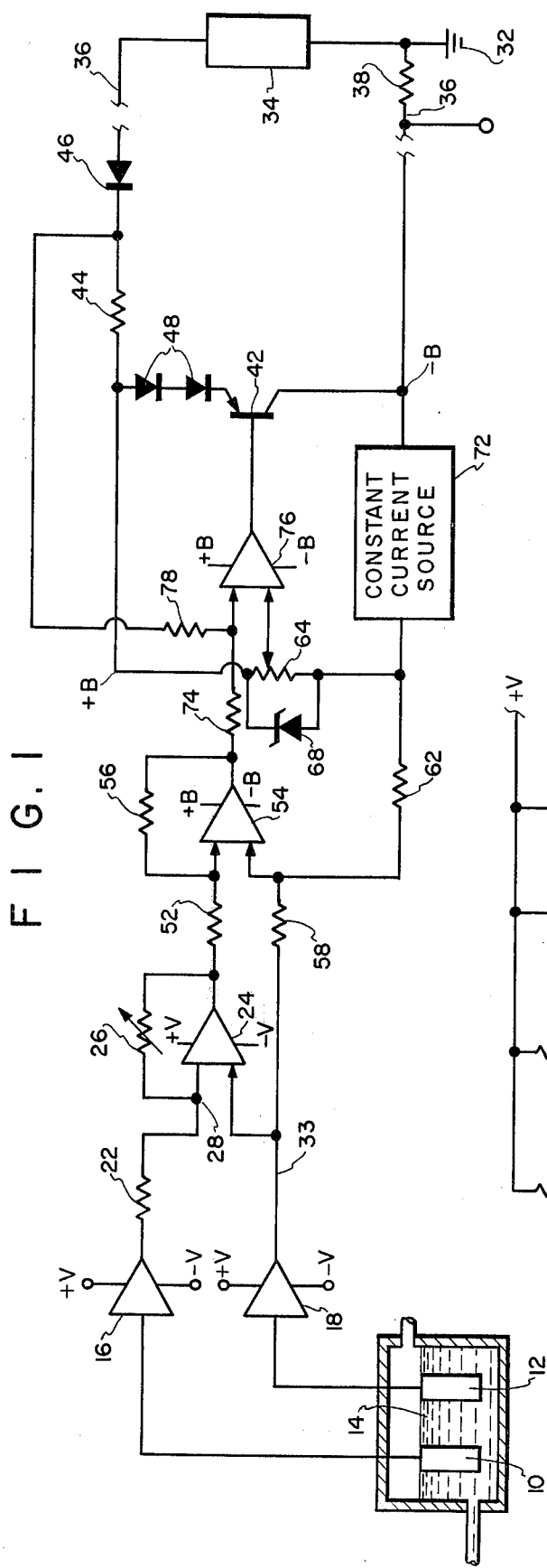

APPARATUS FOR CONVERTING A POTENTIAL SIGNAL DEVELOPED BETWEEN TWO HIGH IMPEDANCE ELECTRODES TO A CURRENT SIGNAL AND FOR TRANSMITTING THIS CURRENT SIGNAL TO A REMOTE LOCATION OVER A TWO WIRE TRANSMISSION

BACKGROUND OF THE INVENTION

1. Field of the Invention

This invention relates to a voltage to current converter and transmitter for high output impedance transducers and, more particularly, to a so-called two-wire system for converting and transmitting the output of a high impedance transducer such as a glass-electrode pH determining system.

2. Description of the Prior Art

While prior art two-wire transmitters have been generally satisfactory, they have not been useful with certain high output impedance transducers, such as glass-electrode pH measuring systems. In order to understand the reason why prior art two-wire systems are not satisfactory, it is helpful to understand the glass-electrode pH measuring system. As will be appreciated by those skilled in the art, pH is a measure of the effective acidity or alkalinity of a solution. Pure water itself dissociates to a slight degree to form hydrogen ions and hydroxyl ions in equal concentration. The extent of this dissociation is expressed as the ion product constant of water, the value of which for pure water is $10^{-7}$ mols per liter. pH is the negative logarithm of the ion product; thus, neutral water as a pH of 7. Since the pH expression is logarithmic, there is a ten-fold change in hydrogen ion concentration per unit change in pH. The pH scale is normally considered to have a range between a pH of 0 and a pH of 14, although theoretically it is possible to have pH values beyond these limits.

The acid-base properties of an aqueous solution can be measured in a number of different ways. One of the most common, and the one to which this invention particularly relates, is the so-called glass-electrode method of measuring pH. In the glass-electrode method, two electrodes are in contact with a solution whose pH is to be measured.

One electrode is referred to as the glass-electrode and the other is known as the reference electrode. The glass-electrode is basically a glass tube closed at its bottom by a membrane of special pH sensitive glass. A buffered chloride solution, or other suitable solution, fills the tube, at least partially, so that it is in contact with the inner wall of the glass membrane. A wire, such as a silver wire coated with silver chloride, is immersed in the buffered chloride solution and forms the internal element of the glass-electrode. This wire is connected to an amplifier which converts a voltage signal generated by the glass-electrode cell whose magnitude is a function of solution pH to a current signal and transmits the current signal to a remotely located utilization device. The amplifier advantageously is located in close proximity to the electrode and is coupled thereto by a short length of insulated cable.

The potential of the glass-electrode, alone, cannot be measured so the second element, a reference electrode, is inserted in the solution. While the basic purpose of the reference electrode is to complete the electrical circuit, it must also provide a potential against which the varying potential of the glass-electrode can be measured. Typically, a reference electrode includes an elctrolytic cell consisting of a silver wire coated with silver chloride which is in contact with a potassium chloride electrolyte. Contact with the sample solution is made through a liquid junction which provides a path for electron flow from the electrode to the sample solution. With this outward flow of electrolyte, the internal cell of the reference electrode is in contact with a solution which is unchanging in concentration and thus provides a stable reference potential.

The output impedances of the glass-electrode and the reference electrode are, respectively, $10^8$ ohms and $10^4$ ohms. Any appreciable current flow through the electrodes would cause an erroneous measurement and, in addition, temporary or permanent damage to the electrodes. For this reason, special amplifiers having a high input impedance and low bias currents have been developed such as, for example, U.S. Pat. No. Re. 27,688 issued to D. J. Soltz et al for "pH Detecting Device Using Temperature Compensating Field-Effect Transistor Differential Amplifier." While generally satisfactory, amplifiers such as the Soltz et al amplifier, do not provide high input impedance or low bias current when the design bias conditions do not prevail, such as a power failure condition, for example.

In addition, such prior art amplifiers require the bias supply power for the input amplifiers to be isolated from the power supply ground. This requirement has prevented the use of so-called two-wire systems such as that shown in U.S. Pat. No. Re. 27,596 issued to E.T. Hurd, III entitled "Two Wire MV/V Transmitter." This system (Hurd) cannot be used because of low input impedance when power is off. In addition, it is undesirable because of the need for bias power isolation for the input signal conditioning means.

SUMMARY OF THE INVENTION

An object of this invention is the provision of an improved two-wire potential to current converter and transmitter which derives, from a high impedance source a voltage signal which floats with respect to power supply ground, a current signal which can be transmitted to a remote utilization device over the same two wires which power the amplifier. In addition, it is an object of this invention to eliminate circulating ground currents through the electrode system and other circulating currents in the event of amplifier bias loss, such as occurs during a power failure.

Briefly, this invention contemplates the provision of a millivolt to current converter and transmitter for a glass-electrode pH measuring system in which the outputs of the glass-electrode and the reference electrode are respectively coupled to the inputs of a pair of impedance converting amplifiers. These amplifiers are biased to accommodate a range of input potentials sufficient to handle the range over which the electrode potentials can be expected to float with respect to the power supply ground potential. Diodes prevent current flow through the electrodes in the event of a loss of bias to the converting amplifiers.

The outputs of these two channels are compared with each other and with a reference potential in order to produce an output signal which controls, via a feedback resistor, the current flow in a two-wire transmission line. The reference potential is generated by the current flow through the two-wire transmission line in order to establish a current flow within the proper operating range.

BRIEF DESCRIPTION OF THE DRAWINGS

A better understanding of the present invention may be had from the following detailed description when read in connection with the accompanying drawings in which:

FIG. 1 is a schematic diagram of one embodiment of the invention; and

FIG. 2 is a detailed schematic diagram of a preamplifier and impedance converter which can be used in the embodiment of the invention shown in FIG. 1.

DETAILED DESCRIPTION

Referring now to FIG. 1, a measuring glass-electrode 10 and a reference electrode 12 are immersed in a solution 14 whose pH is to be determined. The outputs of electrodes 10 and 12 are coupled, respectively, as inputs to suitable signal impedance converting amplifiers 16 and 18, respectively. Each of these amplifiers possesses unity gain and each functions to provide an output signal whose voltage amplitude is a function of its input voltage amplitude without drawing any appreciable current from the electrode 10 or the electrode 12. One suitable design for the construction of amplifiers 16 and 18 is shown in FIG. 2. At this point, it should be noted that amplifiers 16, 18 prevent the flow of current through the electrodes even though the potential of the solution 14 in which the electrodes are immersed is different from the reference or ground potential of the remotely located power supply 20.

The range of signals produced by changes in pH in a glass-electrode system is on the order of 0.5 volts. in a typical installation, the difference in potential between the solution 12 and the power supply ground may be on the order of ±6 volts. The bias on amplifiers 16 and 18, denoted as +V and −V in FIG. 1, should be sufficient to accommodate a range of input signals, e.g., ±6.5 volts.

The difference in potential between the outputs of unity gain amplifiers 16 and 18 is directly proportional to the difference in potential between the glass electrode 10 and the reference electrode 12. As will be appreciated by those skilled in the art, the potential generated by electrode 10 is a function of the temperature of the solution 14 as well as its pH. One way to offset each temperature caused change is to use a temperature compensating resistor 22 whose resistance increases or decreases with temperature at the same rate as the potential of the glass-electrode 10, respectively, increases or decreases with temperature. It should be noted that this resistor 22 should be physically located in the proximity to electrode 10 so that it is subjected to the same temperature determining factors as the electrode 10.

The outputs of amplifier 18 are coupled to the inverting and noninverting inputs, respectively, of a differential amplifier 24. A variable resistor 26 couples the output of amplifier 24 ($V_{24}$ out) to a summing junction 28. A feedback current through resistor 26 makes the inputs at the inverting and noninverting terminals of amplifier 24 equal. This current ($I_{22}$) also flows through resistor 22 ($R_{22}$) owing to the low input bias current of amplifier 24. Since the potential at 28 is equal to the reference electrode ($V_{ref}$) and the potential at the output of amplifier 16 is equal to the potential of the glass-electrode ($V_{gls}$), the output of amplifier 24 can be made independent of glass-electrode potential variation, caused by temperature, if $R_{22}$ varies with temperature by the same amount as the glass-electrode potential changes with temperature. If such conditions are met, the output of amplifier 24 will be a potential which is proportional to the pH of the solution floating on the potential of the reference potential.

For example:

$$I_{22} = \frac{V_{ref} - V_{gls}}{R_{22}}$$

and since $$V_{(24\ out)} = V_{ref} + I_{22} \cdot R_{26}$$

then $$V_{(24\ out)} = V_{ref} + \left[ \frac{(V_{ref} - V_{gls}) \cdot R_{26}}{R_{22}} \right]$$

since $$(V_{ref} - V_{gls}) = K_1(\text{temp}) \cdot (7 - \text{pH})$$

and $$V_{(24\ out)} = V_{ref} + \frac{(7 - \text{pH})}{R_{22}} \cdot R_{26}$$

provided $R_{22}$ varies with temperature as $K_1$ (temp).

The output potential of amplifier 24, relative to the potential of the reference electrode, is equal to the amplitude of the current through resistor 26 multiplied by the value of that resistor. Resistor 26, therefore, can serve as a span determining resistor. It will be appreciated that this output signal is referenced to the potential of the reference electrode which in turn floats at the potential of the solution 14. This potential, in general, typically differs from a power supply earth/ground potential 32 which is located remotely and in close proximity to a power supply 34. Usually, this earth/ground potential is coupled to the negative terminal of the power supply.

As will be appreciated by those skilled in the art, in a two-wire telemetering system, the magnitude of the current flowing in the power supply leads 36 is a function of the measured variable; in this case, the pH of the solution 14. Typically, this current (4 to 20 ma, for example) is converted to a voltage signal by a resistor 38, and this signal can be used as an input to a suitable utilization device such as an indicator, for example.

A transistor 42 controls the flow of current through the power supply 34 and resistor 38. This current, including the current required for powering the amplifiers and other active elements of the circuit, flows through a feedback resistor 44. A diode 46 prevents reverse current flow in the event of abnormal conditions, such as, for example, a power supply reversal, and diodes 48 establish a suitable bias into which amplifier 76 output can operate.

In order to provide a reference which places the output of transistor 42 and amplifier 76 within a proper range despite large differences between the potential reference electrode 12 which rides on the potential of solution 14 and the power supply ground 32, an intermediate reference potential is obtained. This reference potential is derived from the potential at the junction of resistor 44 and diode 46. Constant current source 72 possesses a regulated current through resistor 44 and resistor 64 in parallel with diode 68. To the end of providing a control signal for transistor 42, a resistor 52 couples the output of amplifier 24 to one input of a differential amplifier 54. A feedback resistor 56 couples the output of amplifier 54 to its input producing the output such that the two inputs to amplifier 54 are equal. A resistor 58 couples the other input of amplifier 54 to the output of reference electrode pre-amplifier 18. A resistor 62 couples this other input to amplifier 54 to this intermediate reference potential.

It should be noted that this feedback arrangement provides a level shift for the incoming signals from the pH cell and insures that the currents flowing in the leads 36 are within the proper operating range (4 to 20 ma, for example) irrespective of any differences in the potential between the reference electrode 12 and power supply ground 32.

A resistor 74 couples the output of amplifier 54 to one input of another differential amplifier 76. The potentiometer 64 provides an adjustable reference potential as the other input to amplifier 76. A resistor 78 couples the feedback resistor 44 back to the noninverting input of amplifier 76 and the output of amplifier 76 is coupled to the base of transistor 42. Thus, it will be appreciated that the output of the amplifier controls the current through the feedback resistor to the end that the current flow through feedback resistor 44 is proportional to the difference in potential between electrodes 10 and 12.

In operation, suppose the reference electrode rides on a d.c. bias that is +5 volts with respect to the power supply ground and the difference in potential between the glass and reference electrode is +0.3 volt. The output of amplifier 24 will be a signal proportional to the +0.3 volt signal. Amplifiers 54 and 76 level shift this signal into an operating range which is independent of the +5 volt difference in ground potentials. One input to amplifier 76 is proportional to the sum of the signal voltage ($V_s$) plus the feedback voltage. This is compared with a reference developed by potentiometer 64 and produces an output current in leads 36 proportioned between the glass and reference electrodes and riding on a fixed bias current; for example, a current of 4 ma, which is used for powering the system, plus a 0 to 16 ma signal proportional to the difference in glass and reference electrode potentials.

Referring now to FIG. 2, a suitable amplifier for use as a pre-amplifier 16 or 18 may be constructed and operated generally similar to that disclosed in the aforementioned Soltz patent. As in the Soltz patent, a pair of FET transistors 85 and 83 are connected to a differential amplifier with the input from the glass or reference electrode coupled through a resistor 66 to the base of one FET. A difference amplifier 88 provides relatively low impedance output which is coupled to amplifier 24 for FIG. 1. It should be noted that in this amplifier a pair of diodes 90 prevent current flow in the event of a power supply failure.

The embodiments of the invention in which an exclusive property or privilege is claimed are defined as follows:

1. Apparatus for converting a potential difference signal developed between two electrodes which have a high internal impedance to a current signal and for transmitting this current signal to a remote location over a two-wire transmission line which has in series a power supply, one side of which is coupled to a ground reference potential to provide power for the converting and transmitting apparatus, comprising in combination:
   a first amplifier having a relatively high impedance input terminal and a relatively low impedance output terminal;
   a second amplifier having a relatively high impedance input terminal and a relatively low impedance output terminal;
   means coupling one electrode to the input terminal of the first amplifier and means coupling the other electrode to the input terminal of the second amplifier;
   differential amplifying means including a pair of input terminals and an output terminal for producing a signal at said output terminal whose magnitude is a function of the difference between the signals coupled to said input terminals;
   means for coupling the output of said first amplifier to one of said input terminals;
   means for coupling the output of said second amplifier to the other of said pair of input terminals;
   means including a constant current source coupling said two-wire transmission line to said other of said input terminals in order to reference the signal at said output terminal of said difference amplifying means to ground potential of said power supply and to establish the signal at said output terminal within a predetermined range; and
   means including a feedback impedance in said two-wire transmission line for controlling the flow of current in said transmission line as a function of the signal level at the output terminal of said difference amplifying means.

2. Apparatus for converting a potential difference signal developed between two electrodes which have a high internal impedance to a current signal and for transmitting this current signal to a remote location over a two-wire transmission line which has in series a power supply, one side of which is coupled to a ground reference potential to provide power for the converting and transmitting apparatus as defined in claim 1 wherein said means for coupling the output of said first amplifier and the means for coupling the output of said second amplifier to the input terminals of said difference amplifying means includes means whose impedance varies with temperature at a rate proportional to the rate at which the difference in potential between said electrodes varies as a function of temperature.

3. Apparatus for converting a potential difference signal developed between two electrodes which have a high internal impedance to a current signal and for transmitting this current signal to a remote location over a two-wire transmission line which has in series a power supply, one side of which is coupled to a ground reference potential to provide power for the converting and transmitting apparatus as defined in claim 1 wherein said first amplifying means and said second amplifying means, respectively, comprise a pair of field effect transistors interconnected to form a differential amplifier and including a pair of diodes to limit current flow in the event of power failure.

4. Apparatus for converting a potential difference signal developed between two electrodes which have a high internal impedance to a current signal and for transmitting this current signal to a remote location over a two-wire transmission line which has in series a power supply, one side of which is coupled to a ground reference potential to provide power for the converting and transmitting apparatus as defined in claim 2 wherein said first amplifying means and said second amplifying means, respectively, comprise a pair of field effect transistors interconnected to form a differential amplifier and including a pair of diodes to limit current flow in the event of power failure.

* * * * *